United States Patent [19]

Sprague

[11] Patent Number: 4,694,197
[45] Date of Patent: Sep. 15, 1987

[54] CONTROL SIGNAL GENERATOR

[75] Inventor: David L. Sprague, Hopewell, N.J.

[73] Assignee: RCA Corporation, Princeton, N.J.

[21] Appl. No.: 816,283

[22] Filed: Jan. 6, 1986

[51] Int. Cl.[4] .......................... H03K 5/06; H03L 7/00
[52] U.S. Cl. .................................... 307/269; 307/480;
307/606; 377/76
[58] Field of Search ............... 307/269, 480, 606, 597,
307/261; 377/76, 78, 80; 328/62, 59

[56]  References Cited

U.S. PATENT DOCUMENTS

| | | | |
|---|---|---|---|
| 3,474,260 | 10/1969 | Frohbach | 307/607 |
| 3,575,610 | 4/1971 | Okubo | 377/76 |
| 3,648,102 | 3/1972 | Bettin | 377/78 |
| 3,969,706 | 7/1976 | Proebsting et al. | 340/173 R |
| 4,417,158 | 11/1983 | Ito et al. | 328/62 |
| 4,433,252 | 2/1984 | Lewis | 307/269 |
| 4,472,645 | 9/1984 | White | 307/608 |
| 4,494,021 | 1/1985 | Bell et al. | 307/591 |

Primary Examiner—Stanley D. Miller
Assistant Examiner—Timothy P. Callahan
Attorney, Agent, or Firm—Allen LeRoy Limberg; Paul J. Rasmussen; Eric P. Herrmann

[57] ABSTRACT

A number of control signals for accessing a random access memory may be generated using a cascade connection of data latches. A control signal generator produces two non-overlapping timing signals and their complements from a single input clock signal. The non-overlapping signals of each type are connected to alternate ones of the data latches in the cascade chain. The input to the data latch chain receives the memory access pulse which is then used to derive the various control signals for the random access memory. A plurality of flip-flops have their set and reset terminals connected to the output terminals of various ones of the data latches to produce output control signals from each flip-flop. These control signals have the desired timing relationship to the access pulse.

5 Claims, 3 Drawing Figures

CONTROL SIGNAL GENERATOR

The present invention relates to apparatus for generating a plurality of control signals and specifically to such apparatus useful for generating the signals necessary to address a random access memory in a computer.

BACKGROUND OF THE INVENTION

Dynamic random access memories (dynamic RAM or DRAM) used in computer systems require a very complex set of control signals in order to successfully read data out of or write data into the RAM. For example, the Texas Instruments TMS 4464, a 65,536 word by four bit dynamic RAM, requires a row address strobe, column address strobe and write and read enable signals. These signals must be generated so that they are properly timed not only with respect to each other but with respect to the address and data signals also being applied to the RAM.

Such standard dynamic RAM's use a multiplexed address scheme to reduce the pin count of the integrated circuit. The multiplexed addresses correspond to the internal memory cell array configuration of rows and columns, i.e., a row address enables a row of memory elements in the memory cell array and the column address accesses the particular cell in the row that is in the addressed column. The addressing may be further complicated in custom memory applications where not only are the row and column addresses multiplexed together but they are time multiplexed onto a single bus along with the data to further reduce the pin count. With these custom devices, additional control signals must be provided for the off chip multiplexing of the address and data signals.

The timing of the control signals involved in the memory cycle are influenced by the structure of the memory array and the address and logic. As a result, generating the necessary control signals for a dynamic RAM is rather complex, particularly when one is attempting to operate the RAM as close to its optimal specified timing as possible. In addition, it is desirable to allow the control signal timing to be changed easily to account for changes in the RAM specifications or the redesign of the computer system that results in changes to the timing requirements of the memory subsystem.

Conventional delay lines have been used to generate various control signals as is shown in U.S. Pat. No. 4,494,021 issued to A. G. Bell et al. In these delay lines, a common clock signal is applied to every stage so that each stage is clocked in unison. Therefore, the minimum time period between the generation of different control signals is one cycle of the input clock. In certain applications this input clock may operate at 25 MHz resulting in a 40 nanosecond clock period. Therefore at best, a different control signal could be produced only every 40 nanoseconds from a conventional tapped delay line. For optimal access to some RAM's, a 20 nanosecond timing period is desired. The only way of achieving this with a conventional tapped delay line is to double the clock frequency to 50 MHz which may not be practical, especially if the delay line is fabricated using CMOS technology.

Another method for generating these RAM control signals would be a finite state machine consisting of a programmed logic array (PLA) and a latch. By changing the PLA, the timing of the circuit could be altered. A problem with this approach develops when the memory control signal generator is fabricated on a CMOS integrated circuit which limits the maximum clock frequency to approximately 25 MHz. A PLA based state machine would be too slow to generate the precise 20 nanosecond timing.

SUMMARY OF THE INVENTION

An apparatus for generating a plurality of control signals from a single input clock signal having a given frequency comprises a plurality of N data latches. The data latches have their input and output terminals connected in cascade and may be ordinally numbered 1 through N. A clock circuit produces two non-overlapping timing signals from the input clock signal. The timing signals of one type are connected to the odd numbered data latches and the other type are connected to the even numbered data latches. The non-overlapping timing signals clock data from one data latch to the next through the cascade connection. A plurality of flip-flops have their set and reset terminals connected to the output terminals of various data latches so as to produce an output control signal from each flip-flop which has the desired timing relationship to said input clock signal.

DETAILED DESCRIPTION OF THE PREFERRED EMBODIMENT

Figure 1:
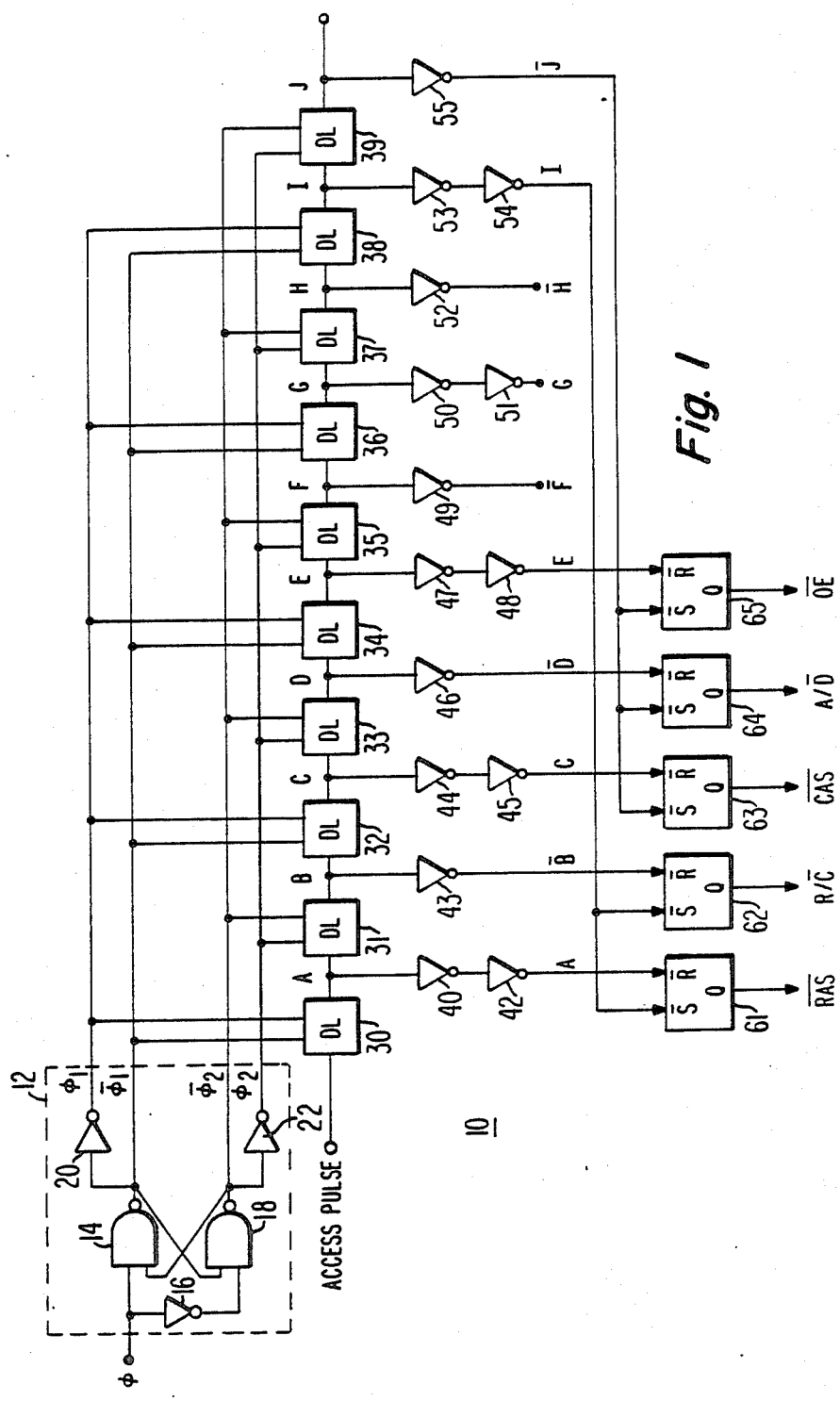
FIG. 1 is a block schematic diagram of a control signal generator according to the present invention.

FIG. 1 shows a control signal generator 10 according to the present invention to produce a series of signals. These control signals can be used, by way of example, to access a RAM in a computer system. The signal generator 10 includes a clocking signal generator 12 which receives a conventional clock signal $\phi$ as an input from the computer system and produces two non-overlapping timing signals $\phi_1$ and $\phi_2$ and their complements from that input clock signal.

Figure 3:
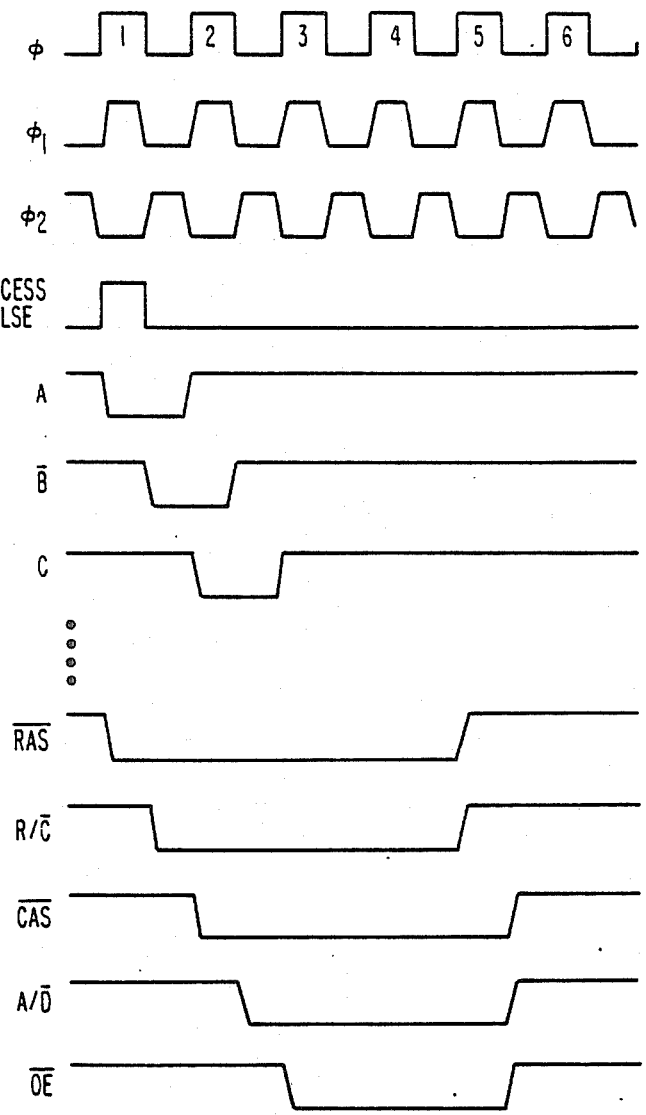
FIG. 3 is a timing diagram for the signals at various nodes of the FIG. 1 circuit.

Specifically, the clocking signal generator 12 consists of a first dual input NAND gate 14 having one input connected to the input clock signal $\phi$. The input clock signal is also connected to the input of a first inverter 16 whose output is connected to one input terminal of a second NAND gate 18. The output of the second NAND gate 18 is connected to the other input of the first NAND gate 14 and the output of the first NAND gate 14 is connected to the other input of the second NAND gate 18. The outputs of the first and second NAND gates 14 and 18 are connected to first and second output inverters 20 and 22, respectively. The first output inverter 20 produces the first timing signal $\phi_1$ with its complement $\overline{\phi_1}$ at the output of the first NAND gate 14. The second output inverter 22 produces the second timing signal $\phi_2$ with its complementary signal being produced at the output of the second NAND gate 18. As shown in FIG. 3 the rise and fall portions (and the high level phases) of the $\phi_1$ and $\phi_2$ pulses do not overlap.

The timing signals generated by the clocking generator 12 are applied to a cascade chain of ten data latches (DL) designated 30–39. The first data latch 30 has its input terminal connected to the access pulse signal generated by the computer for addressing the random access memory. The output of the first data latch 30 is connected to the input terminal of the second data latch 31 creating a node A between the first and second data latches. The remaining data latches are connected in series forming nodes B through I therebetween. The last data latch 39 has its output connected to node J. Alternate ones of the data latches receive timing signals of the same type, that is the first type of timing signals $\phi_1$ and $\bar{\phi}_1$ are connected to the even numbered data latches, while the second type of timing signals $\phi_2$ and $\bar{\phi}_2$ are connected to the odd numbered data latches.

Figure 2:
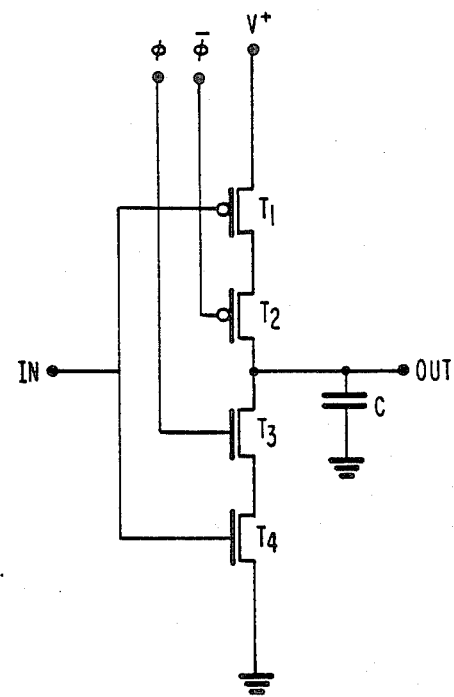
FIG. 2 is a schematic diagram of the circuitry for each data latch in the FIG. 1 generator.

FIG. 2 represents the typical circuitry which may be used for one of the data latches 30–39 in FIG. 1. Each data latch consists of two P type transistors T1 and T2 having their conduction paths connected in series between a source of a positive voltage V+ and the output terminal of the data latch. Two N type transistors T3 and T4 have their conduction paths connected in series between the output terminal and ground potential. The input terminal of the data latch is connected to the gates of transistors T1 and T4 and the timing signals of one phase are connected to the gates of the other two transistors T2 and T3. Specifically, the timing signal $\phi_1$ or $\phi_2$, depending upon the particular data latch being considered, is connected to the gate of transistor T3 and the complement of the timing signal $\phi_1$ or $\phi_2$ is connected to the gate of transistor T2. The intrinsic capacitance C, present at the output terminal when the data latch is formed in an integrated circuit, provides a small storage capacitance for the data latch. As will be evident from the data latch circuit in FIG. 2, the signal at the output terminal will be inverted from the signal present at the input terminal. Therefore, the access pulse at nodes A, C, E, G and I (FIG. 1) will be the inversion of the pulse as it was applied to the input of the first data latch 30 and the access pulse at nodes B, D, F, H and J will have the same polarity as the input access pulse. This change in polarity of the propagation of the access pulse signal must be taken into account when the signal is tapped at various nodes.

Returning to the description of FIG. 1, the circuit 10 includes five flip-flops 61–65 to produce the various control signals for the random access memory. The set and reset inputs to these flip-flops are active on a low input pulse and are connected to various nodes in the data latch chain. Because the charge between each of the data latch stages is held by a relatively small capacitance, the data latch outputs must be buffered in order to drive the flip-flop set and reset inputs. This buffering is provided by a plurality of inverters 40–55.

As noted above, the access pulse is inverted at alternate nodes A–J of the data latch chain. Assuming a high level access pulse is applied to the first data latch 30, the access signal at the outputs of the even numbered data latches will be low and has to be buffered by two inverters to provide the negative going pulse necessary to reset or set, as the case may be, the flip-flops 61–65. For example, a positive going input access pulse will be inverted at node A to provide a negative going pulse. Therefore, the connection of node A to the reset terminal of the first flip-flop 61 is via two inverters 40 and 42 to provide a double inversion and a negative going pulse at the reset terminal. The propagated access pulse will be positive at the outputs of the odd numbered data latches and a single inverter is used to couple these nodes to the flip-flops. For example, at node B the access signal has been reinverted by data latch 31 to a positive pulse and a single inverter 43 couples that node to the reset terminal of the second flip-flop 62 to provide a negative going pulse at that reset terminal.

Node C is connected to the reset terminal of flip-flop 63 by two inverters 44 and 45 connected in series and flip-flop 64 has its reset terminal connected to node D via a single inverter 46. Node E is connected via two inverters 47 and 48 to the reset terminal of the fifth flip-flop 65. Nodes F through H have a single inverter 49, two inverters 50 and 51 and a single inverter 52 respectively, connected to them to provide additional output signals from the divider chain if such signals later become necessary. By providing inverters 49–52, the timing of the control signals may be easily altered by changing the set or reset connections of the flip-flops.

The output of data latch 38 at node I is connected through two inverters 53 and 54 to the set terminals of the first and second flip-flops 61 and 62. The output of data latch 39 at node J is coupled through a single inverter 55 to the set terminals of the third, fourth and fifth flip-flops 63, 64 and 65, respectively.

With reference to FIGS. 1 and 3 the control signal generator 10 receives an input clock signal $\phi$. The clock signal generator 12 derives the non-overlapping timing signals $\phi_1$ and $\phi_2$ from the input clock signal. With reference to FIG. 3, the rise and fall portions of the timing signals $\phi_1$ and $\phi_2$ (and their complements) do not overlap in time. When these timing signals are applied to the delay latches 30–39 only alternate ones of the latches are rendered conductive to the access pulse at any given time. Therefore, the access signal will only propagate through one data latch at a time. It should be noted that two stages of the data latch chain are clocked for every cycle of the input clock signal. This has the effect of doubling the clock frequency without requiring signals at twice the clock frequency. These timing signals are continuously generated whether or not the computer system is trying to access the memories.

In the illustrative example, the computer accesses the memories by applying a positive access signal pulse to the control signal generator 10 which defines the reference point from which all of the output signals are timed. This access pulse is applied the first data latch 30 which is enabled by the first timing signals $\phi_1$ and $\bar{\phi}_1$ to produce the inversion of the access pulse at node A. This negative going pulse is buffered by inverters 40 and 42 and applied to the reset input of the first flip-flop 61. The output of the first flip-flop 61 is thereby reset to produce a low row access signal RAS. During the next half cycle of the input clock signal $\phi$, the second data latch 31 is rendered conductive by the second timing signals $\phi_2$ and $\bar{\phi}_2$ to produce a positive going access pulse at Node B. The positive pulse at node B is inverted by inverter 43 to produce the $\bar{B}$ pulse, which is applied to the reset terminal of the second flip-flop 62 to produce a low level output row/column multiplex signal R/$\bar{C}$.

Similarly, the access pulse is propagated down the data latch chain on half cycles of the input clock, so as to produce the column access signal $\overline{CAS}$ at the output of the third flip-flop 63, an address/data bus multiplex signal A/$\overline{D}$ at the output of the fourth flip-flop 64, and the output enable signal $\overline{OE}$ at the output of the fifth flip-flop 65.

Upon the occurrence of the fifth pulse of the input clock $\phi$, the penultimate data latch 38 produces a negative going pulse at node I which is transmitted by inverters 53 and 54 to the set terminals of the first and second flip-flops 61 and 62. This negative going signal sets the output of these flip-flops to a high level terminating the $\overline{RAC}$ and the $R/\overline{C}$ low-level signals. Upon the occurrence of the low going transition of the fifth input clock pulse $\phi$, the final data latch 39 produces a positive going pulse at Node J which is inverted by inverter 55 and coupled to the set inputs of the third, fourth and fifth flip-flops 63, 64 and 65, respectively. This set signal terminates the low level output signals from each of these flip-flops as shown in FIG. 3.

The precise timing of the output signals from the control signal generator 10 may be varied by connecting the set and reset terminals of the flip-flops 61-65 to various nodes in the cascade chain of delay latches. Furthermore, additional delay latches may be added to the chain to provide output pulses of longer duration or having different timing relationships to those shown in FIG. 3.

What is claimed is:

1. an apparatus for generating a plurality of rectangular-wave control signals timed from a single input clock signal having a given frequency, said apparatus comprising:
   a plurality of N data latches having respective input and output terminals connected to place said data latches in cascade connection, and being consecutively ordinally numbered first through $N^{th}$ in order of their arrangement in said cascade connection;
   pulse generating means for applying pulses at selected times to the input terminal of said first data latch;
   means for producing first annd second non-overlapping timing timing signals from said clock signal, said first timing signal being applied only to the odd-numbered data latches and said secodn timing signal being applied only to the even-numbered data latches to clock a stream of ONEs and ZEROs through said cascade connection of said N data latches in a serial shift register operation, said ONEs being generated by said first data latch when pulses are applied to its input terminal and said ZEROs being generated by said first data latch between pulses being applied to its input terminal; and
   means responsive to digital signals from the output terminals of said data latches for generating said plurality of rectangular-wave control signals, which means comprises
   a plurality of flip-flops, each having respective set and reset terminals connected to the output terminals of different ones of said data latches and having a respective output terminal to produce a respective one of said rectangular-wave control signals.

2. An apparatus for generating a plurality of rectangular-wave control signals in response to a reference pulse using a single input clock signal, said apparatus comprising:
   a plurality of N data latches having their input and output terminals connected in cascade and ordinally numbered 1 through N, said reference pulse being applied to the input terminal of the first data latch;
   means for clocking alternate ones of said data latches on alternate half cycles of said input clock signal so that no two consecutive data latches are enabled at the same time; and
   means responsive to the output of said data latches for generating said plurality of rectangular-wave control signals, which means comprises
   a plurality of flip-flops, each having respective set and reset terminals connected to the output terminals of different ones of said data latches and having a respective output terminal to produce a respective one of said rectangular-wave control signals.

3. The apparatus as in claim 2 wherein the means for clocking comprises a generator producing two non-overlapping timing signals, one type of timing signal being connected only to even numbered data latches and the other type of timing signal being connected to the odd numbered data latches.

4. The apparatus as in claim 3 wherein said means for producing two non-overlapping timing signals further includes means for producing the complement of each of the two non-overlapping signals.

5. The apparatus as in claim 4 wherein said means for producing two non-overlapping timing signals comprises:
   a first logic gate having an input terminal connected to said input clock signal and having an output terminal;
   a first inverter having an input terminal connected to said input clock signal and having an output terminal;
   a second logic gate, of the same type as the first logic gate, having one input terminal connected to the output terminal of said first inverter and another input terminal connected to the output terminal of the first logic gate and having an output terminal connected to another input terminal of said first logic gate; and
   second and third inverters each having an input terminal connected to a different logic gate output terminal.

* * * * *

UNITED STATES PATENT AND TRADEMARK OFFICE
CERTIFICATE OF CORRECTION

PATENT NO. : 4,694,197
DATED : Sep. 15, 1987
INVENTOR(S) : David L. Sprague

It is certified that error appears in the above-identified patent and that said Letters Patent is hereby corrected as shown below:

Col. 2, line 58, "$\phi_1$" should be --$\overline{\phi_1}$--

Col. 2, line 61, before "being" insert --$\overline{\phi_2}$--

Col. 3, line 10, "$\phi_1$" second occurrence, should be --$\overline{\phi_1}$--

Col. 3, line 12, "$\phi_2$" should be --$\overline{\phi_2}$--

Col. 3, line 27, "$\phi_1$ or $\phi_2$" should be --$\overline{\phi_1}$ or $\overline{\phi_2}$--

Col. 4, line 44, "$\phi_1$" second occurrence, should be --$\overline{\phi_1}$--

Col. 4, line 52, "$\phi_2$" second occurrence, should be --$\overline{\phi_2}$--

Col. 5, line 3, "$\overline{RAC}$" should be --$\overline{RAS}$--

Claim 1, line 36, "secodn" should be --second--.

Signed and Sealed this

Twelfth Day of January, 1988

Attest:

DONALD J. QUIGG

Attesting Officer

Commissioner of Patents and Trademarks